(12) United States Patent
Yamamoto

(10) Patent No.: US 10,707,636 B2
(45) Date of Patent: Jul. 7, 2020

(54) BOARD INSERTION DEVICE

(71) Applicant: Panasonic Intellectual Property Management Co., Ltd., Osaka (JP)

(72) Inventor: Minoru Yamamoto, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 284 days.

(21) Appl. No.: 15/644,936

(22) Filed: Jul. 10, 2017

(65) Prior Publication Data

US 2018/0040999 A1 Feb. 8, 2018

(30) Foreign Application Priority Data

Aug. 2, 2016 (JP) ................................. 2016-151645

(51) Int. Cl.
*H01R 43/26* (2006.01)
*G06F 1/18* (2006.01)
*H05K 3/36* (2006.01)

(52) U.S. Cl.
CPC ............ *H01R 43/26* (2013.01); *G06F 1/185* (2013.01); *H05K 3/366* (2013.01); *H05K 2201/10159* (2013.01); *H05K 2201/10189* (2013.01); *H05K 2203/0195* (2013.01)

(58) Field of Classification Search
CPC .................... G06F 1/185; H01R 43/26; H05K 2201/10159; H05K 2201/10189; H05K 2203/0195; H05K 3/366
See application file for complete search history.

(56) References Cited

U.S. PATENT DOCUMENTS

| 3,885,287 | A | * | 5/1975 | Long | H01B 13/012 |
| | | | | | 29/705 |
| 4,223,934 | A | * | 9/1980 | Cauceglia | H05K 7/1415 |
| | | | | | 29/278 |
| 4,858,309 | A | * | 8/1989 | Korsunsky | H01R 12/7005 |
| | | | | | 29/764 |
| 5,265,328 | A | * | 11/1993 | Gorman | H01R 43/26 |
| | | | | | 29/278 |
| 6,062,894 | A | * | 5/2000 | Barringer | H05K 7/1415 |
| | | | | | 439/377 |
| 7,913,379 | B2 | * | 3/2011 | Bodenweber | G06F 1/185 |
| | | | | | 29/739 |
| 2006/0185159 | A1 | | 8/2006 | Correll et al. | |
| 2012/0011700 | A1 | * | 1/2012 | Kelaher | H05K 7/1415 |
| | | | | | 29/464 |
| 2018/0040999 | A1 | * | 2/2018 | Yamamoto | H01R 43/26 |

* cited by examiner

*Primary Examiner* — Minh N Trinh
(74) *Attorney, Agent, or Firm* — Pearne & Gordon LLP

(57) ABSTRACT

A board insertion device includes a holder; and an insertion guider which is slidably provided in the holder in an insertion direction of the board into the connector and includes a distal end portion protruding in the insertion direction from a first end surface of the board held in the holder and abutting against the connector during insertion of the board into the connector. Furthermore, the board insertion device includes an abutting portion; and a conversion mechanism converting a change of a relative position between the holder and the insertion guider into a movement of the abutting portion for changing a position of the ejector from a closed position to an open position. in which the conversion mechanism is provided in the insertion guider and engaged with the holder or is provided in the holder and engaged with the insertion guider.

13 Claims, 16 Drawing Sheets

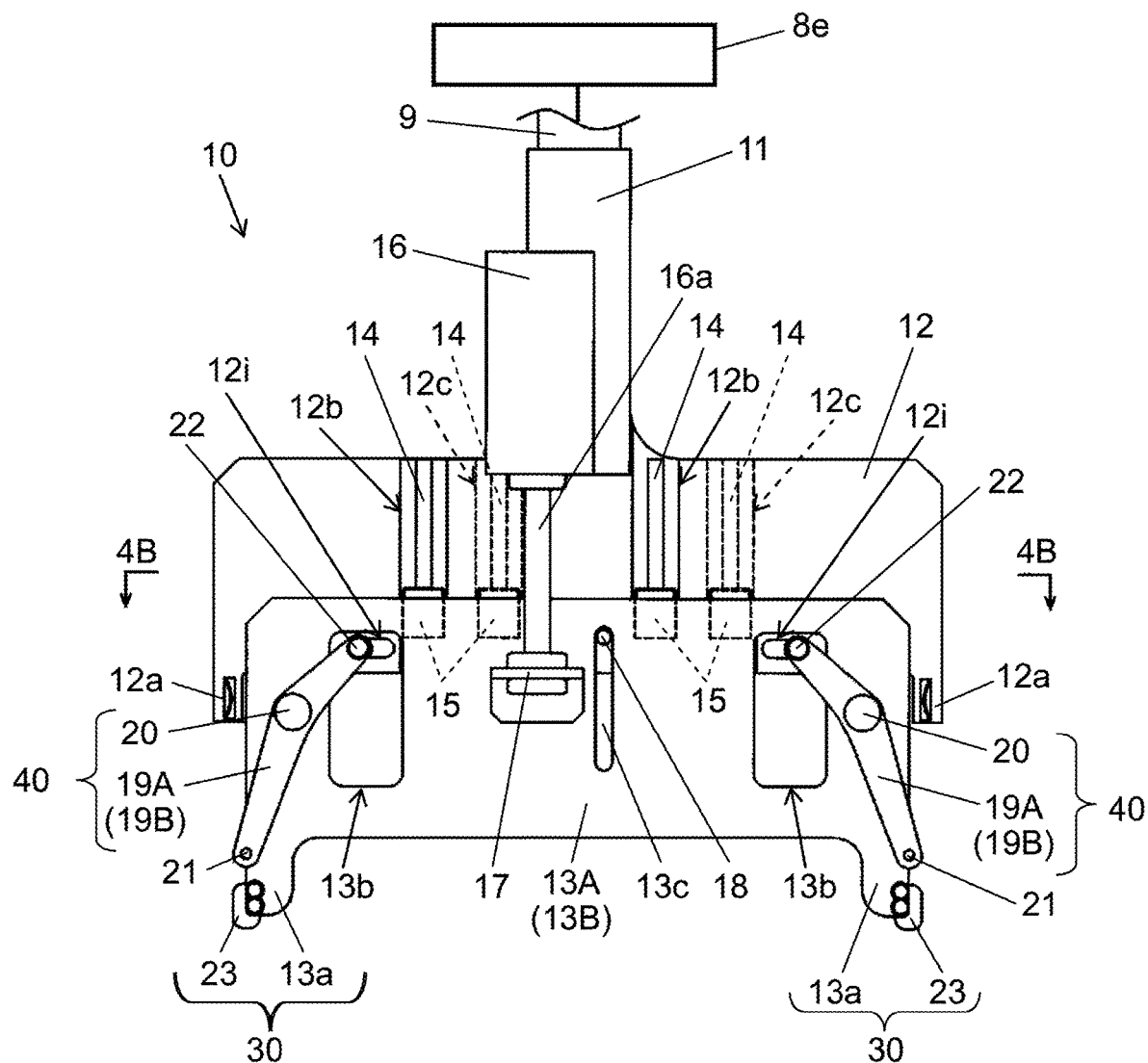
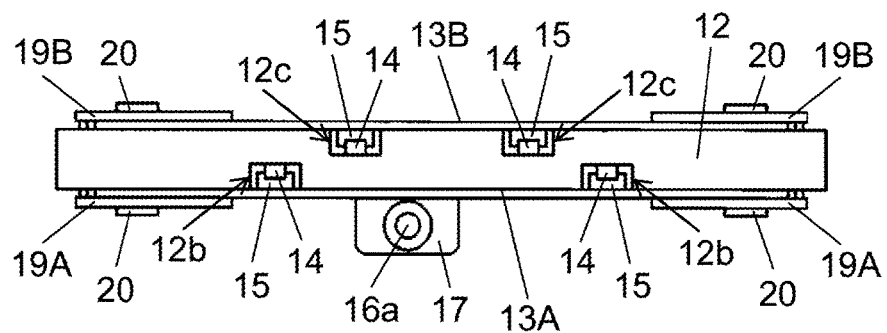

ional circuit of a personal computer. The installation of the memory modules is performed by inserting connection terminals formed on an end surface of the memory module into connectors provided in parallel in the motherboard. In the related art, installing work of the memory modules has been performed manually and an operator holds the memory modules by the fingers and inserts the memory modules into the connectors, or insertion work into connectors is performed in a state where the memory modules are held in a dedicated insertion tool. For example, Patent Literature 1 (US Patent Application Publication No. 2006/0185159) is referred. In the related art disclosed in Patent Literature 1, an insertion tool in which packages to be inserted are installed is manually aligned to connectors provided on a circuit board and the insertion tool is pressed against the circuit board, thereby inserting the packages into the connectors.

SUMMARY

A board insertion device which inserts a board into a connector, in which the board has a first end surface on which a terminal is provided, and a second end surface opposite to the first end surface, in which the connector has an insertion groove into which the board is inserted and an ejector capable of being switched between an open position at which insertion of the board into the insertion groove is allowed and a closed position at which the insertion of the board into the insertion groove is prohibited, in which the board insertion device includes:

a holder holding the board in a state where the first end surface is exposed;

an insertion guider which is slidably provided in the holder in an insertion direction of the board into the connector and includes a distal end portion protruding in the insertion direction from the first end surface of the board held in the holder and abutting against the connector during insertion of the board into the connector;

an abutting portion abutting against the ejector during the insertion of the board into the connector; and a conversion mechanism converting a change of a relative position between the holder and the insertion guider into a movement of the abutting portion for changing a position of the ejector from the closed position to the open position, and in which the conversion mechanism is provided in the insertion guider and engaged with the holder or is provided in the holder and engaged with the insertion guider.

BRIEF DESCRIPTION OF THE DRAWINGS

FIG. 4A is a front view of a board insertion tool (board insertion device) used in the board installation apparatus of the embodiment;

FIG. 4B is a sectional view that is taken along line 4B-4B of FIG. 4A;

DETAILED DESCRIPTION

The related art including Patent Literature 1 and manually performing installation of the memory module has the following problems. When installing the memory module, it is necessary to push the end surface of the module board, on which a large number of connection terminals are formed, against the inside of the connector, in which a large number of connection terminals are formed, in a state of ensuring contact between the terminals. Therefore, the operator is required to push the memory module with a considerable pressing force during the installing operation and in a case where an operator continuously inserts a large number of memory modules, a workload becomes large. When inserting the memory module into the connector, it is necessary to manipulate an ejector provided for each connector to be an insertable state. As described above, the manual insertion work of the memory module of the related art requires a cumbersome operation and labor, and labor saving and improvement in work efficiency are desired.

Figure 1A:
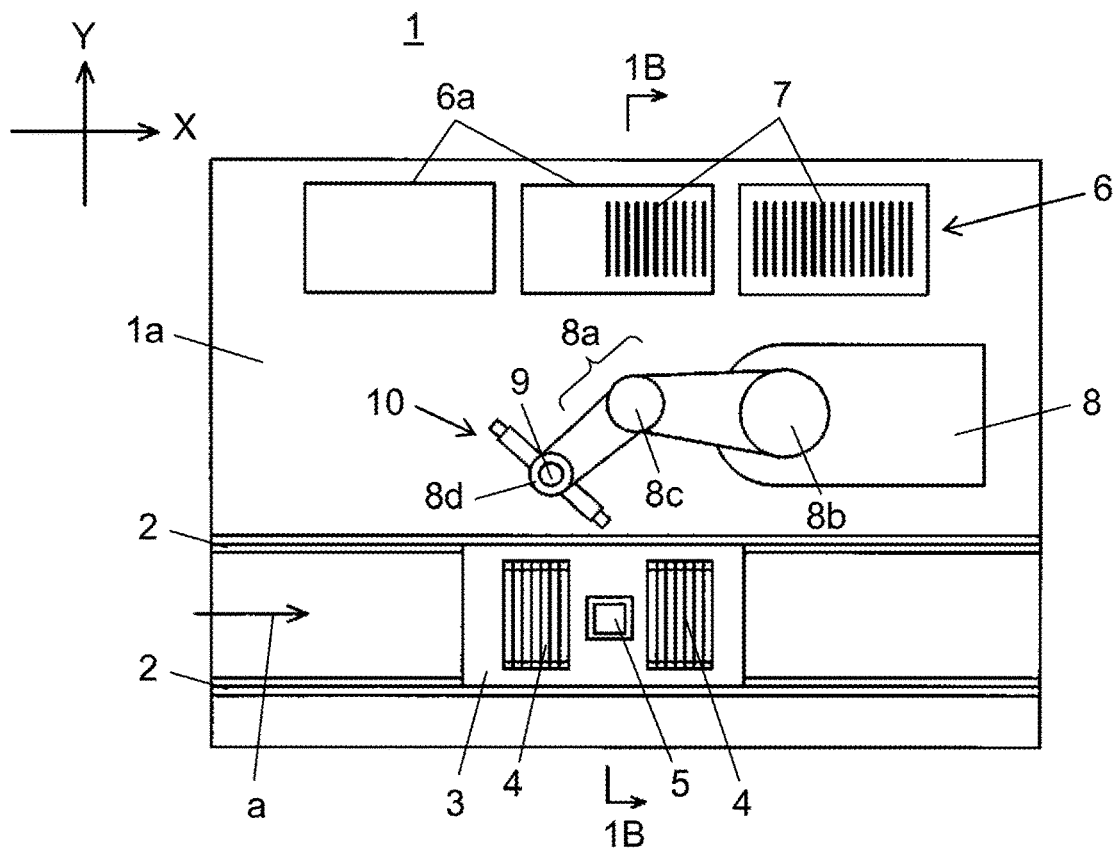
FIG. 1A is a schematic top view of a board installation apparatus of an embodiment.
Figure 1B:
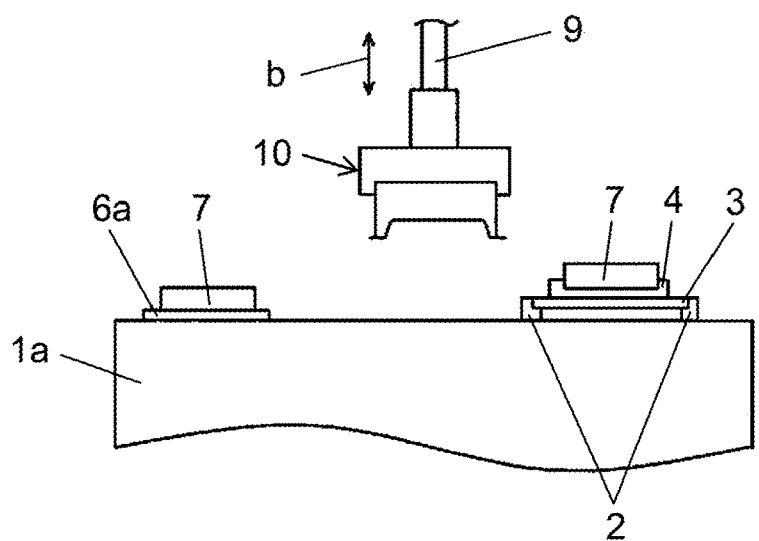
FIG. 1B is a sectional view that is taken along line 1B-1B of FIG. 1A.

Next, an embodiment of the disclosure will be described with reference to the drawings. First, a configuration of board installation apparatus 1 will be described with reference to FIGS. 1A and 1B. FIG. 1A is a schematic top view of board installation apparatus 1 of the embodiment. FIG. 1B is a sectional view that is taken along line 1B-1B of FIG. 1A. Board installation apparatus 1 has a function of installing board 7 (see FIGS. 2A and 2B) including connection terminals on an end surface such as a memory module, on electronic board 3 by inserting board 7 into connector 4 (see FIGS. 3A and 3B) provided in electronic board 3 such as a motherboard.

In FIG. 1A, board transport mechanism 2 is disposed at one end portion of an upper surface of base stand 1a in an X direction (electronic board transporting direction). Board transport mechanism 2 receives (arrow a) electronic board 3 provided with connector 4 into which the board is inserted, from an upstream side device and positions and holds electronic board 3 at a work position using a board installation mechanism described below. Board supplier 6 having a configuration, in which a plurality of boards 7 are stored in storage plate 6a in a vertical posture, is disposed at an end portion on a side opposite to board transport mechanism 2 in base stand 1a. Here, an example, in which a plurality of storage plates 6a storing the plurality of boards 7 are disposed in board supplier 6, is illustrated.

The board installation mechanism having a configuration performing an installation operation of board 7 by moving board insertion tool 10 by work robot 8 is disposed between board supplier 6 and board transport mechanism 2. Work robot 8 is a horizontal multi-joint robot having work arm 8a including joint portions 8b, 8c, and 8d respectively rotating around a vertical axis. Board insertion tool 10, which is the board insertion device in the embodiment, is installed in a lower end portion of elevation shaft 9 installed in most distal joint portion 8d of work arm 8a.

As illustrated in FIG. 1B, elevation shaft 9 moves up and down (arrow b) by elevation drive mechanism 8e (see FIG. 4A) built in joint portion 8d. Board insertion tool 10 has a function of holding board 7 and a function of inserting held board 7 into connector 4. With such a configuration, the plurality of boards 7 stored in storage plate 6a of board supplier 6 in the vertical posture can be picked up by board insertion tool 10 one by one and be inserted into connectors 4 of electronic board 3 positioned and held by board transport mechanism 2.

Figure 2A:
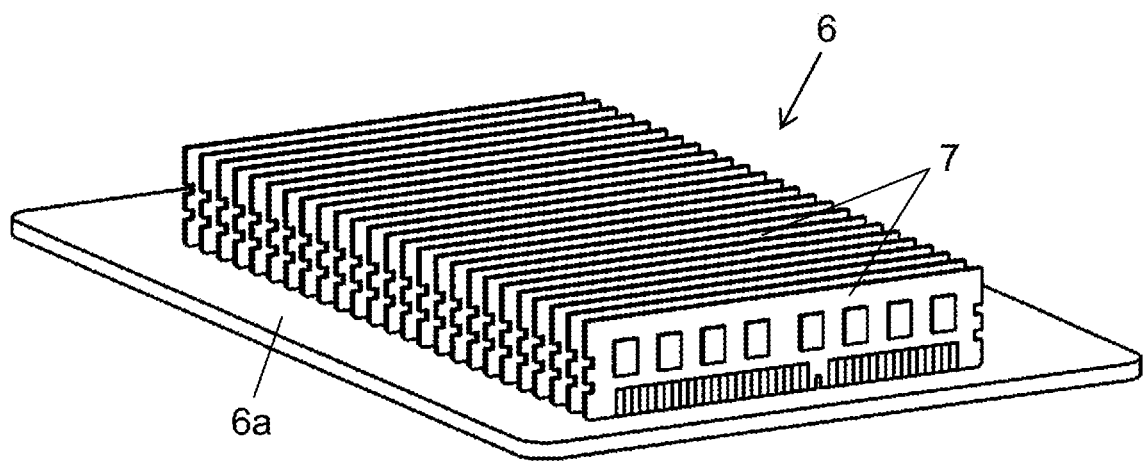
FIG. 2A is a perspective view of a board supplier used in the board installation apparatus of the embodiment.
Figure 2B:
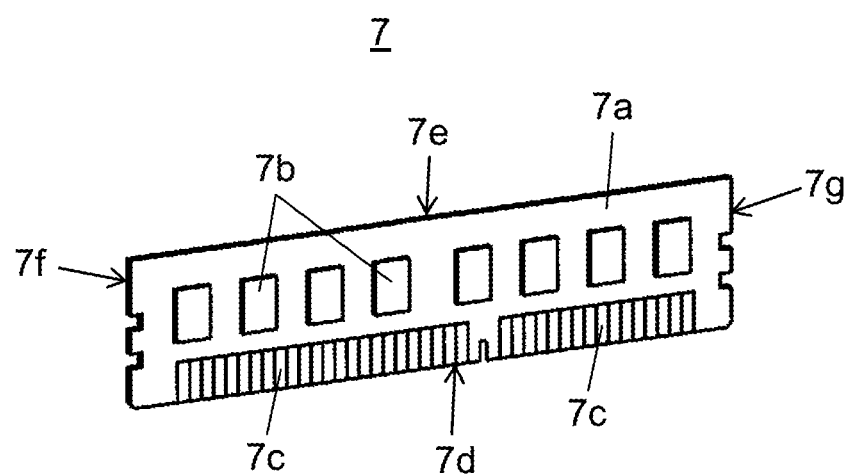
FIG. 2B is an explanatory view of a board used in the board installation apparatus of the embodiment.

Here, a configuration of board supplier 6 and board 7 will be described with reference to FIGS. 2A and 2B. As illustrated in FIG. 2A, the plurality of elongated rectangular boards 7 are stored on an upper surface of planar storage plate 6a. As illustrated in FIG. 2B, board 7 is mainly configured of thin plate-like plate 7a and a plurality of memory elements 7b are formed in plate 7a. A plurality of connection terminals 7c are formed on one end surface (first end surface 7d) in plate 7a. When storing board 7 in storage plate 6a, board 7 is stored in storage plate 6a in the vertical posture in which first end surface 7d faces downward, second end surface 7e on a side opposite to first end surface 7d faces upward, and two opposing side end surfaces (third end surface 7f and fourth end surface 7g) other than first end surface 7d and second end surface 7e face sideward.

Figure 3A:
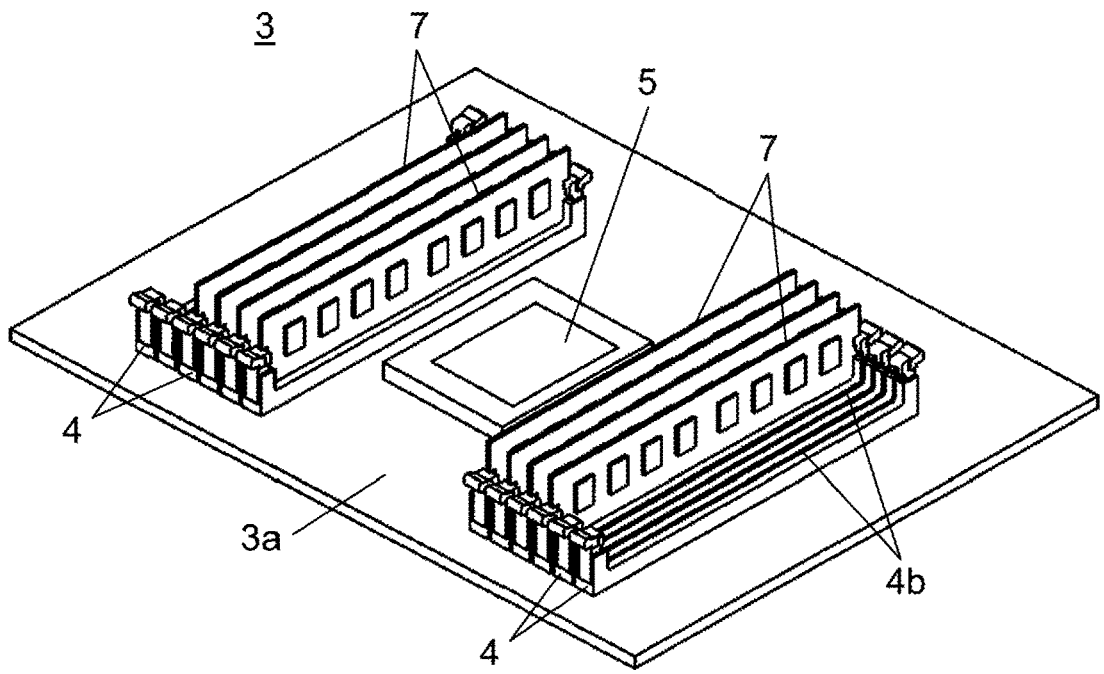
FIG. 3A is a perspective view of an electronic board into which boards are inserted in the board installation apparatus of the embodiment.
Figure 3B:
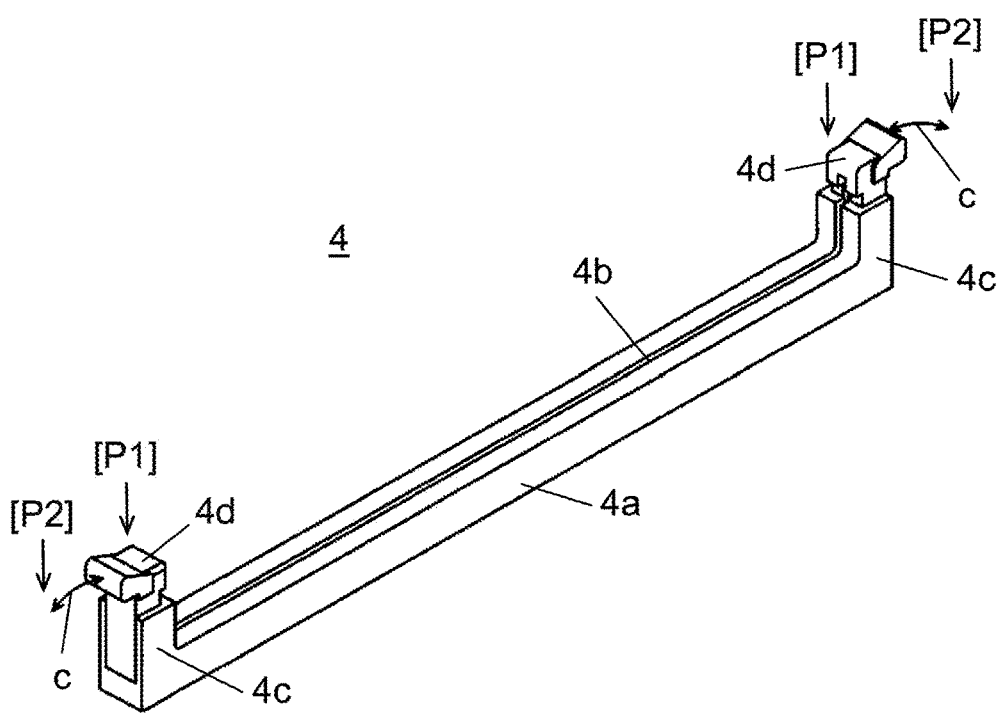
FIG. 3B is a perspective view of a connector used in the board installation apparatus of the embodiment.

Next, configurations of electronic board 3 and connector 4 will be described with reference to FIGS. 3A and 3B. In FIG. 3A, electronic board 3 is configured such that a plurality of connectors 4 are disposed in parallel on an upper surface of rectangular plate member 3a and electronic component 5 is mounted in the vicinity of connector 4. As illustrated in FIG. 3B, connector 4 has elongated rod-like base portion 4a and side edge portions 4c protruding upward from both end portions of base portion 4a. Insertion groove 4b for inserting board 7 is provided on the upper surface of base portion 4a and inner surfaces of side edge portions 4c. Ejectors 4d for prohibiting or allowing insertion of board 7 into insertion groove 4b of connector 4 are installed in side edge portions 4c in variable positions.

That is, in the state illustrated in FIG. 3B, ejectors 4d are in closed positions [P1] and prohibit the insertion of board 7 into insertion groove 4b. On the other hand, ejectors 4d are moved to open positions [P2] by moving (arrows c) ejectors 4d in an inclined direction to the outside and in this state, the insertion of board 7 into insertion groove 4b is allowed (see FIG. 13).

That is, connector 4 is configured to include insertion groove 4b into which board 7 including terminals 7c on first end surface 7d is inserted, and ejectors 4d capable of moving between open position [P2] at which the insertion of board 7 into insertion groove 4b is allowed and closed position [P1] at which the insertion of board 7 into insertion groove 4b is prohibited. Board insertion tool 10 illustrated in the embodiment has a function as the board insertion device which inserts board 7 including terminals 7c on first end surface 7d into connector 4.

Next, an entire configuration of board insertion tool 10 will be described with reference to FIGS. 4A and 4B. FIG. 4A is a front view of board insertion tool 10 (board insertion device) used in board installation apparatus 1 of the embodiment. FIG. 4B is a sectional view that is taken along line 4B-4B of FIG. 4A. In FIG. 4A, coupling member 11 is coupled to a lower end portion of elevation shaft 9 moving up and down by elevation drive mechanism 8e of work robot 8. Holder 12 is connected to a lower portion of coupling member 11. Holder 12 has a shape (see FIG. 5A) in which both end portions of the lower end thereof protrude downward to have holding end portions 12a. Holding end portions 12a have a function of sandwiching and holding side end surfaces of board 7 to be held from both sides.

Insertion guiders 13A and 13B are disposed respectively on a front surface (surface illustrated in FIG. 4A) and a rear surface on a side opposite to the front surface of holder 12 so as to be slidable in a vertical direction, that is, in the insertion direction of board 7 into insertion groove 4b. Insertion guiders 13A and 13B have a shape in which both end portions of lower ends thereof protrude downward to have distal end extending portions 13a. Distal end extending portions 13a have positioning members 23. Distal end extending portions 13a and positioning members 23 function as distal end portions 30 abutting against connector 4 during the insertion of board 7 into connector 4.

A pair of slider groove portions 12b and 12c is formed on the front surface and the rear surface of holder 12 respectively in a vertical direction. As illustrated in FIGS. 4A and 4B, linear rails 14 are respectively and fixedly disposed on bottom surfaces of slider groove portions 12b and 12c in the vertical direction, and sliders 15 are engaged with linear rails 14 slidably in the vertical direction. Among sliders 15, slider 15 within slider groove portion 12b is coupled to insertion guider 13A being slidably in contact with the front surface of holder 12. Slider 15 within slider groove portion 12c is coupled to insertion guider 13B being slidably in contact with the rear surface of holder 12.

Cylinder 16 is disposed in coupling member 11 coupled to holder 12 at a posture in which rod 16a faces downward. A lower end portion of rod 16a is coupled to bracket 17 fixed to insertion guider 13A. Rod 16a is caused to protrude and is retracted by driving cylinder 16 and thereby insertion guider 13A can relatively reciprocate with respect to holder 12 in the vertical direction (insertion direction of board 7 into insertion groove 4b) together with insertion guider 13B. That is, cylinder 16 is a driver which is provided in holder 12 and allows insertion guiders 13A and 13B to relatively reciprocate with respect to holder 12 in the insertion direction of board 7.

Fulcrums 20 and lever members 19A and 19B of which intermediate portions between one end portions and the other end portions are pivotally supported by fulcrums 20 are formed at both side end portions of insertion guiders 13A and 13B respectively. Lever members 19A and 19B are disposed in a state of sandwiching insertion guiders 13A and 13B, and holder 12 from both front and rear surfaces. Pin-like connecting members 21 are provided at the lower end portions (one end portions) of lever members 19A and 19B in a form of connecting lever members 19A and 19B to each other. As described below, connecting members 21 have a function as abutting portions moving ejectors 4d to open positions [P2] by abutting against ejectors 4d during the insertion of board 7 into connector 4. Roller members 22 are provided in the upper end portions (the other end portions) of lever members 19A and 19B by passing through elongated cam holes 12i, which is formed in a laterally elongated shape in holder 12, in a shape of connecting lever members 19A and 19B to each other.

Insertion guiders 13A and 13B move vertically and integrally with lever members 19A and 19B always with the configuration described above. Opening portions 13b are formed at positions corresponding to roller members 22 in insertion guiders 13A and 13B, and do not allow interference between roller member 22 and insertion guiders 13A and 13B during relative movement between insertion guiders 13A and 13B, and holder 12.

As illustrated in FIG. 4A, guide groove 13c having a length corresponding to a prescribed elevation stroke of insertion guider 13A with respect to holder 12 is formed in insertion guider 13A in the vertical direction. Guide pin 18 formed in holder 12 is engaged with guide groove 13c. When insertion guiders 13A and 13B relatively reciprocate with respect to holder 12, a top dead center and a bottom dead center are regulated by the position of guide pin 18 in guide groove 13c.

In FIG. 4B, guide groove 13c, guide pin 18, roller members 22, and cam holes 12i are not illustrated. Since insertion guiders 13A and 13B, and lever members 19A and 19B are front and rear symmetrical with respect to holder 12 and partial shapes and functions thereof are common, in this specification, the same reference numerals are given to the common portions in the drawings and the description thereof will be omitted.

Figure 5A:
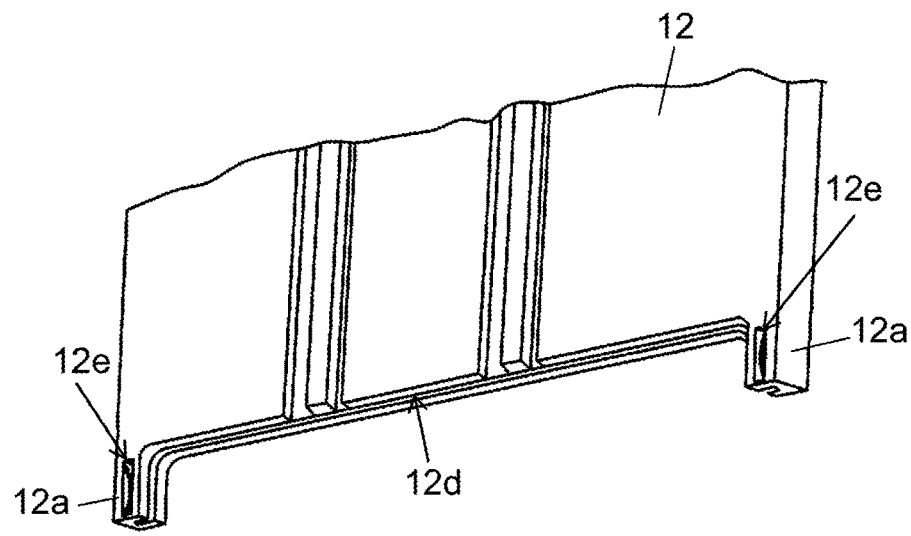
FIG. 5A is an enlarged view of a main portion of a holder in the board insertion device of the embodiment.
Figure 5B:
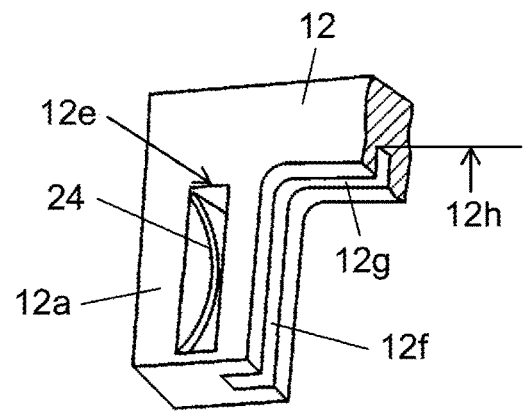
FIG. 5B is an explanatory view of a holding end portion in the board insertion device of the embodiment.
Figure 5C:
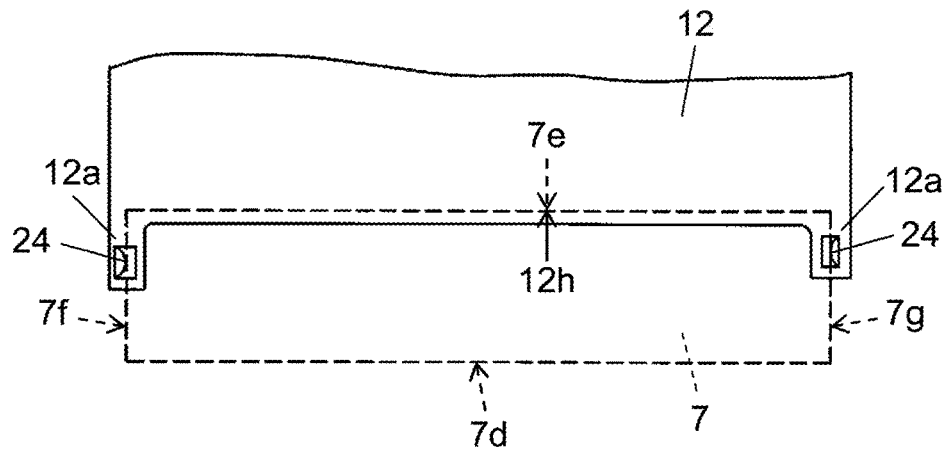
FIG. 5C is a view illustrating a contact state between the board and the holder in the board insertion device of the embodiment.

Next, a function of holder 12 will be described with reference to FIGS. 5A to 5C. FIG. 5A is an enlarged view of a main portion of holder 12 in the board insertion device of the embodiment. FIG. 5B is an explanatory view of holding end portion 12a in the board insertion device of the embodiment. FIG. 5C is a view illustrating a contact state between board 7 and holder 12 in the board insertion device of the embodiment. As illustrated in FIG. 5A, two holding end portions 12a provided to protrude downward from both ends and pressing end portion 12d between two holding end portions 12a are provided in the lower end portion of holder 12. Two holding end portions 12a hold side end surfaces of board 7 to be held. Pressing end portion 12d presses the upper end surface of board 7.

As illustrated in FIG. 5B, rectangular spring storing groove 12e passing through front and rear surfaces is formed in holding end portion 12a and spring member 24 formed of an arcuate leaf spring is installed in spring storing groove 12e at a posture in which a convex surface thereof faces inward. Board storing grooves 12f and 12g into which the end surface of board 7 is inserted are respectively provided on an inside of holding end portion 12a and a lower surface of pressing end portion 12d. An upper surface of board storing groove 12g is formed of pressing portion 12h for pressing board 7 when inserting board 7 into insertion groove 4b by holder 12.

When holding board 7 by holder 12, holder 12 is lowered with respect to board 7 and third end surface 7f and fourth end surface 7g are fitted into board storing grooves 12f on both sides. In this case, convex surfaces of spring member 24 abut against third end surface 7f and fourth end surface 7g, and thereby a gripping force for gripping board 7 acts thereon. Therefore, as illustrated in FIG. 5C, board 7 is held by holder 12 in a state where second end surface 7e abuts against pressing portion 12h of holder 12 and third end surface 7f and fourth end surface 7g facing each other are pressed by the gripping force of spring member 24 from the both sides. In this case, first end surface 7d provided with terminals 7c is in a state of being exposed.

That is, holder 12 holds board 7 having first end surface 7d provided with terminals 7c and second end surface 7e on the opposite side, in a state of exposing first end surface 7d. In order to hold board 7, holder 12 of the embodiment is provided with pressing portion 12h abutting against second end surface 7e of board 7 and spring member 24 as a gripping portion. Spring member 24 grips board 7 by abutting against two side end surfaces (third end surface 7f and fourth end surface 7g).

As the gripping portion, spring member 24 pressing at least one of third end surface 7f and fourth end surface 7g may be provided, and the both sides of third end surface 7f and fourth end surface 7g are not necessarily pressed. In the example illustrated in the embodiment, board 7 is rectangular and side end surfaces (third end surface 7f and fourth end surface 7g) are used as portions to be gripped, but in a case of board 7 having an irregular shape other than the rectangular shape, two end surfaces facing each other, other than first end surface 7d and second end surface 7e of board 7 are to be gripped.

Figure 6A:
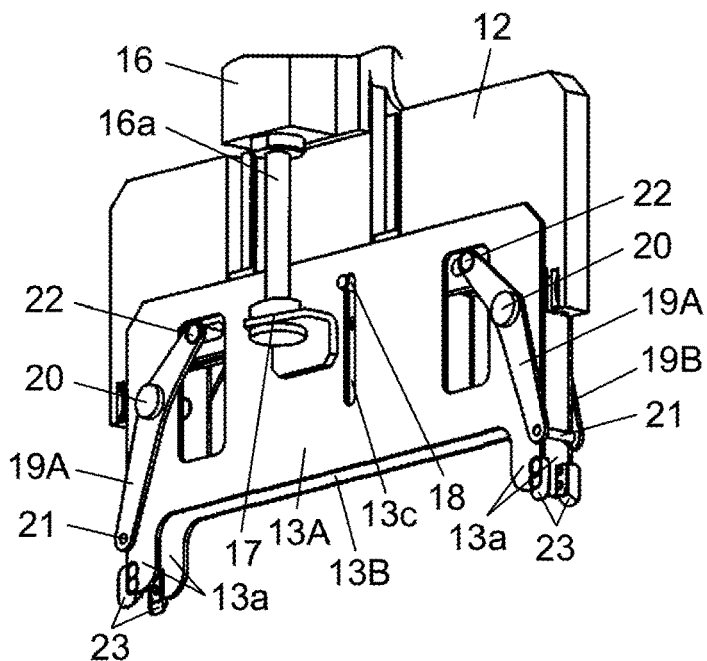
FIG. 6A is an explanatory view of a configuration of an insertion guider in the board insertion device of the embodiment.

Next, a function of insertion guiders 13A and 13B will be described with reference to FIGS. 6A to 6C. FIG. 6A illustrates a perspective view from an obliquely lower side in a state of lowering insertion guiders 13A and 13B to the bottom dead center with respect to holder 12 in a state where holder 12 does not hold board 7 (see FIG. 4A). In this state, guide pin 18 is positioned at the uppermost end of guide groove 13c and connecting members 21 at the lower end portions of lever members 19A and 19B are moved inward so that lever members 19A and 19B are in a closed state.

Figure 6B:
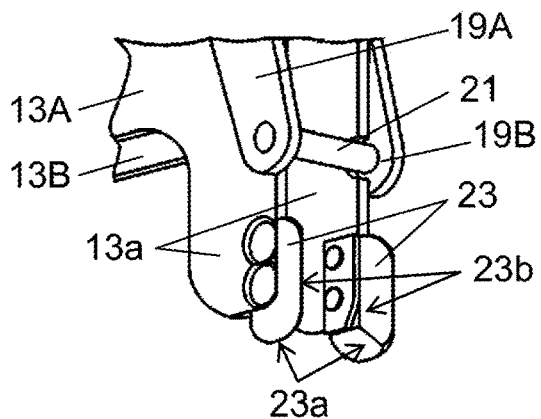
FIG. 6B is an explanatory view of a distal end portion of the insertion guider in the board insertion device of the embodiment.

FIG. 6B illustrates the details of the lower ends of insertion guiders 13A and 13B in this state. Distal end extending portions 13a extend downward from the both end portions of the lower ends of insertion guiders 13A and 13B and positioning members 23 for positioning distal end extending portions 13a by abutting against connector 4 are respectively installed on inner surface sides (sides sandwiching connector 4) of distal end extending portions 13a by spring members. Positioning members 23 have tapered surfaces 23a for correcting a position in the X direction by abutting against base portion 4a and tapered surfaces 23b for correcting a position in the Y direction by abutting against side edge portion 4c. As described above, distal end extending portions 13a and positioning members 23 function as distal end portions 30 abutting against connector 4 during the insertion of board 7 into connector 4. In a case where lever members 19A and 19B are in a closed state, connecting members 21 are positioned at outer edge portions of distal end extending portions 13a.

Figure 6C:
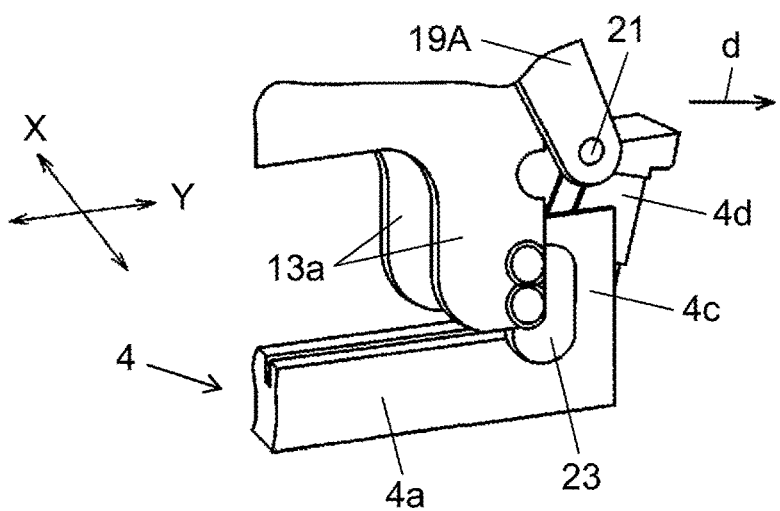
FIG. 6C is an explanatory view of the distal end portion of the insertion guider in the board insertion device of the embodiment.

FIG. 6C illustrates a state where distal end portion 30 abuts against side edge portion 4c of the outer end of base portion 4a by lowering insertion guiders 13A and 13B with respect to connector 4. In this state, positioning surfaces (positioning surfaces 23c and 23d illustrated in FIG. 7A) provided in positioning member 23 abut against the inner surface of side edge portion 4c and the upper surface of base portion 4a, and thereby distal end extending portion 13a is correctly positioned with respect to connector 4. As insertion guiders 13A and 13B are lowered, the lower end portions of lever members 19A and 19B are opened to the outside and thereby connecting members 21 abut against ejectors 4d from the inside and move ejectors 4d to the outside (arrow d).

That is, insertion guiders 13A and 13B are configured to include distal end portions 30 (distal end extending portions 13a and positioning members 23) which are provided slidably with respect to holder 12 in the insertion direction of board 7 into connector 4, protrude downward that is the insertion direction from first end surface 7d of board 7 held in holder 12, and abut against connector 4 during insertion of board 7 into connector 4.

A position correction function of positioning members 23 when insertion guiders 13A and 13B are lowered with respect to connector 4 will be described with reference to FIGS. 7A to 7C. Here, although only distal end extending portion 13a in insertion guider 13B is illustrated and described, in practice, connector 4 is sandwiched by a pair of positioning members 23 installed on the inside of distal end extending portions 13a of insertion guiders 13A and 13B respectively, and thereby the position correction and positioning are performed.

Figure 7A:
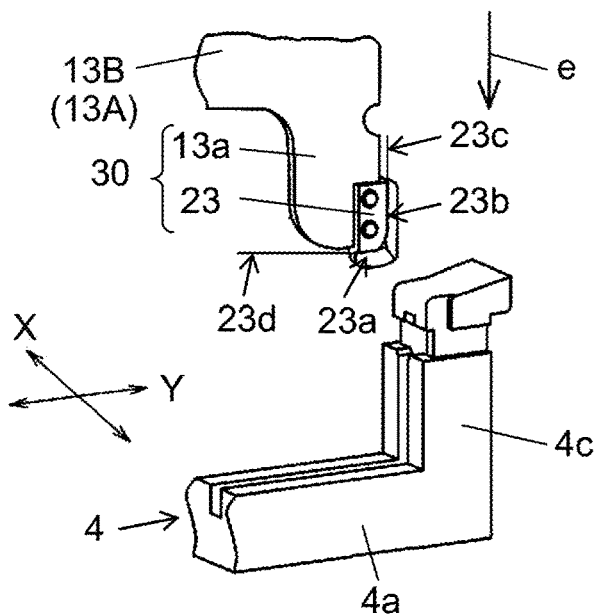
FIG. 7A is an explanatory view of an operation illustrating position correction between the connector and the insertion guider in the board insertion device of the embodiment.
Figure 7B:
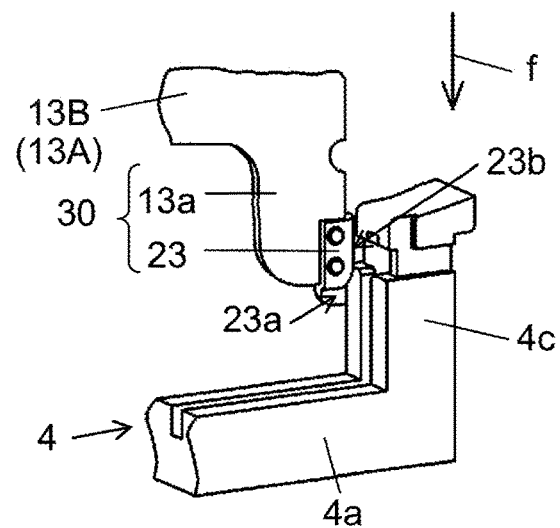
FIG. 7B is an explanatory view of an operation illustrating the position correction between the connector and the insertion guider in the board insertion device of the embodiment.

As illustrated in FIG. 7A, positioning surfaces 23c and 23d, which position distal end extending portion 13a with respect to side edge portion 4c and base portion 4a of connector 4, are provided in positioning member 23 installed in distal end extending portion 13a. Tapered surfaces 23a and 23b for correcting the positional deviations in the X direction and the Y direction of distal end extending portion 13a are formed in positioning member 23.

When insertion guiders 13A and 13B are lowered in order to insert board 7 held in holder 12 into connector 4, first, distal end extending portion 13a is lowered with respect to connector 4 (arrow e). Next, as illustrated in FIG. 7B, when distal end extending portion 13a is further lowered with respect to connector 4 (arrow f), tapered surfaces 23a and 23b abut against connector 4 in a process in which positioning member 23, which is slightly deviated with respect to connector 4 in the X direction and the Y direction, approaches side edge portion 4c.

Figure 7C:
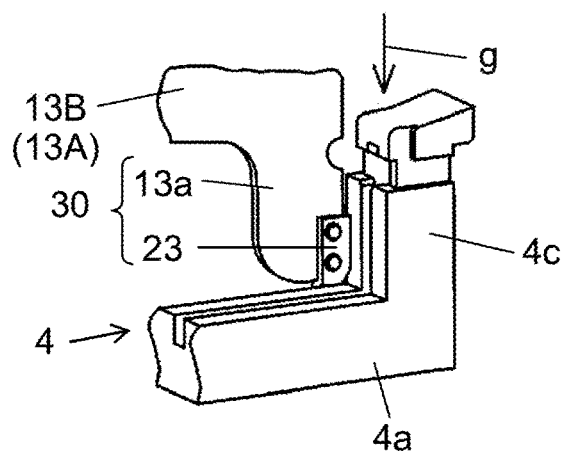
FIG. 7C is an explanatory view of an operation illustrating the position correction between the connector and the insertion guider in the board insertion device of the embodiment.

In this state, when distal end extending portion 13a is further lowered (arrow g), as illustrated in FIG. 7C, positioning member 23 is correctly positioned with respect to side edge portion 4c and base portion 4a of connector 4 by a position guiding operation by tapered surfaces 23a and 23b. Therefore, insertion guiders 13A and 13B, and holder 12 are correctly positioned with respect to connector 4, and thereby board 7 held in holder 12 is also correctly positioned with respect to connector 4 of the insertion object.

That is, in the embodiment, a plurality of distal end portions 30 (distal end extending portions 13a and positioning members 23) provided in insertion guiders 13A and 13B are disposed so as to sandwich connector 4, and tapered surfaces 23a and 23b for the position correction are formed on the contact surfaces with connector 4. The plurality of distal end portions 30 abut against connector 4 and thereby the positional deviation between board 7 held in holder 12 and connector 4 is corrected.

Next, a change in the relative position between holder 12 and insertion guiders 13A and 13B will be described with reference to FIG. 8. Specifically, conversion mechanism 40, in which connecting members 21 which are abutting portions provided at the lower end portions of lever members 19A and 19B change (see FIG. 3) the position of ejector 4d from closed position [P1] to open position [P2], will be described.

Figure 8:
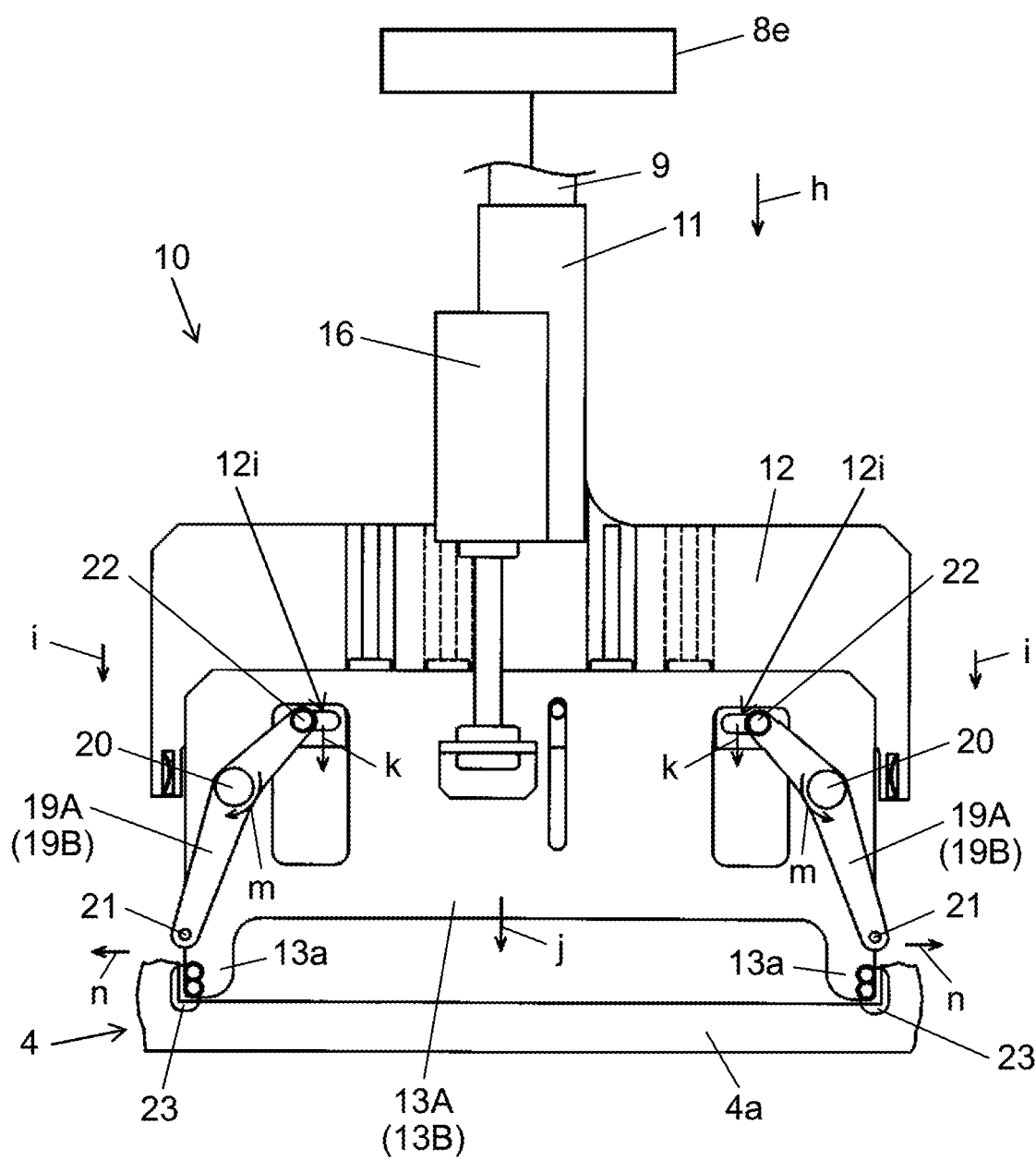
FIG. 8 is an explanatory view of a conversion mechanism in the board insertion device of the embodiment.

As illustrated in FIG. 8, in the board insertion operation by board insertion tool 10, in a state where insertion guiders 13A and 13B are relatively lowered with respect to holder 12, holder 12 and insertion guiders 13A and 13B are lowered with respect to connector 4 by driving elevation drive mechanism 8e (arrow h). Therefore, holder 12 and insertion guiders 13A and 13B are lowered together (arrows i and j) and positioning members 23 of distal end portions 30 of insertion guiders 13A and 13B abut against the upper surface of base portion 4a, and thereby lowering of insertion guiders 13A and 13B is stopped.

Thereafter, holder 12 is relatively lowered with respect to insertion guiders 13A and 13B by further lowering holder 12 by driving elevation drive mechanism 8e. Therefore, roller members 22 engaged with cam holes 12i are pushed downward (arrows k) in lever members 19A and 19B, and lever members 19A and 19B rotate around fulcrums 20 in arrow m direction by an amount of rotation corresponding to a push down amount. As a result, connecting members 21 which are the abutting portions provided in the lower end portions of lever members 19A and 19B are displaced to the outside (arrows n). The converting operation is executed in a state where connecting members 21 are positioned on the inside of ejectors 4d positioned at closed positions [P1], and thereby the positions of ejectors 4d are changed by connecting members 21 from closed positions [P1] to open positions [P2].

Conversion mechanism 40 having the configuration illustrated in the embodiment has lever members 19A and 19B of which the intermediate portions between one end portions and the other end portions are pivotally supported by fulcrums 20 provided in insertion guiders 13A and 13B. Connecting members 21 which are the abutting portions are provided in the lower end portions which are one end portions of lever members 19A and 19B, roller members 22 provided on the other end portions of lever members 19A and 19B are engaged with cam holes 12i provided in holder 12.

In the embodiment, an example, in which lever members 19A and 19B having the configuration described above are provided in insertion guiders 13A and 13B, and roller members 22 are engaged with cam holes 12i of holder 12 to configure conversion mechanism 40, is described, but the disclosure is not limited to the combination example. That is, as long as the change in the relative position between holder 12 and insertion guiders 13A and 13B is converted into the above-mentioned target movement of connecting members 21 as the abutting portions, conversion mechanism 40 is provided in holder 12 or any one of insertion guiders 13A and 13B, and may be engaged with holder 12 or the other of insertion guiders 13A and 13B.

In the embodiment, board installation apparatus 1 is configured as described above, and a board pick-up operation and the board insertion operation by board insertion tool 10 in board installation apparatus 1 will be described with reference to FIGS. 9A to 16. First, the board pick-up operation for picking up board 7 from board supplier 6 by board insertion tool 10 will be described with reference to FIGS. 9A to 9C.

Figure 9A:
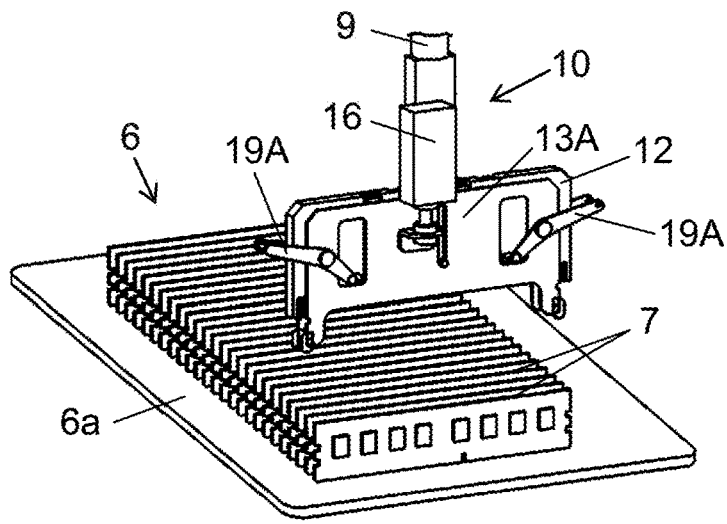
FIG. 9A is an explanatory view of a board pick-up operation in the board installation apparatus of the embodiment.

As illustrated in FIG. 9A, insertion guiders 13A and 13B are in a state of being relatively raised with respect to holder 12 by driving cylinder 16 in board insertion tool 10. In this state, board insertion tool 10 is moved above board supplier 6 by work robot 8 (see FIG. 1) and board insertion tool 10 is positioned so that holder 12 is positioned above board 7 to be picked up among the plurality of boards 7 stored and held in storage plate 6a.

Figure 9B:
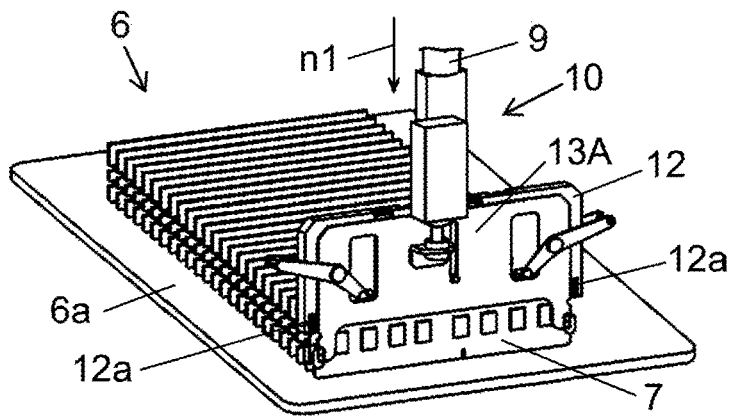
FIG. 9B is an explanatory view of the board pick-up operation in the board installation apparatus of the embodiment.
Figure 9C:
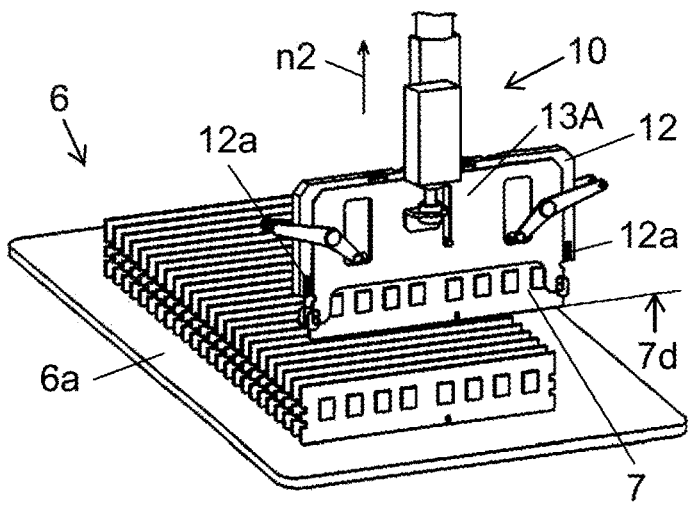
FIG. 9C is an explanatory view of the board pick-up operation in the board installation apparatus of the embodiment.

Next, as illustrated in FIG. 9B, board insertion tool 10 is lowered (arrow n1) by driving elevation drive mechanism 8e (see FIG. 4A) and holder 12 is pressed against board 7, thereby gripping and holding board 7 by spring members 24 (see FIG. 5) of holding end portions 12a from the both sides. In this state, as illustrated in FIG. 9C, holder 12 holds board 7 in a state where first end surface 7d (see FIG. 2) is exposed, by raising (arrow n2) board insertion tool 10.

Figure 10:
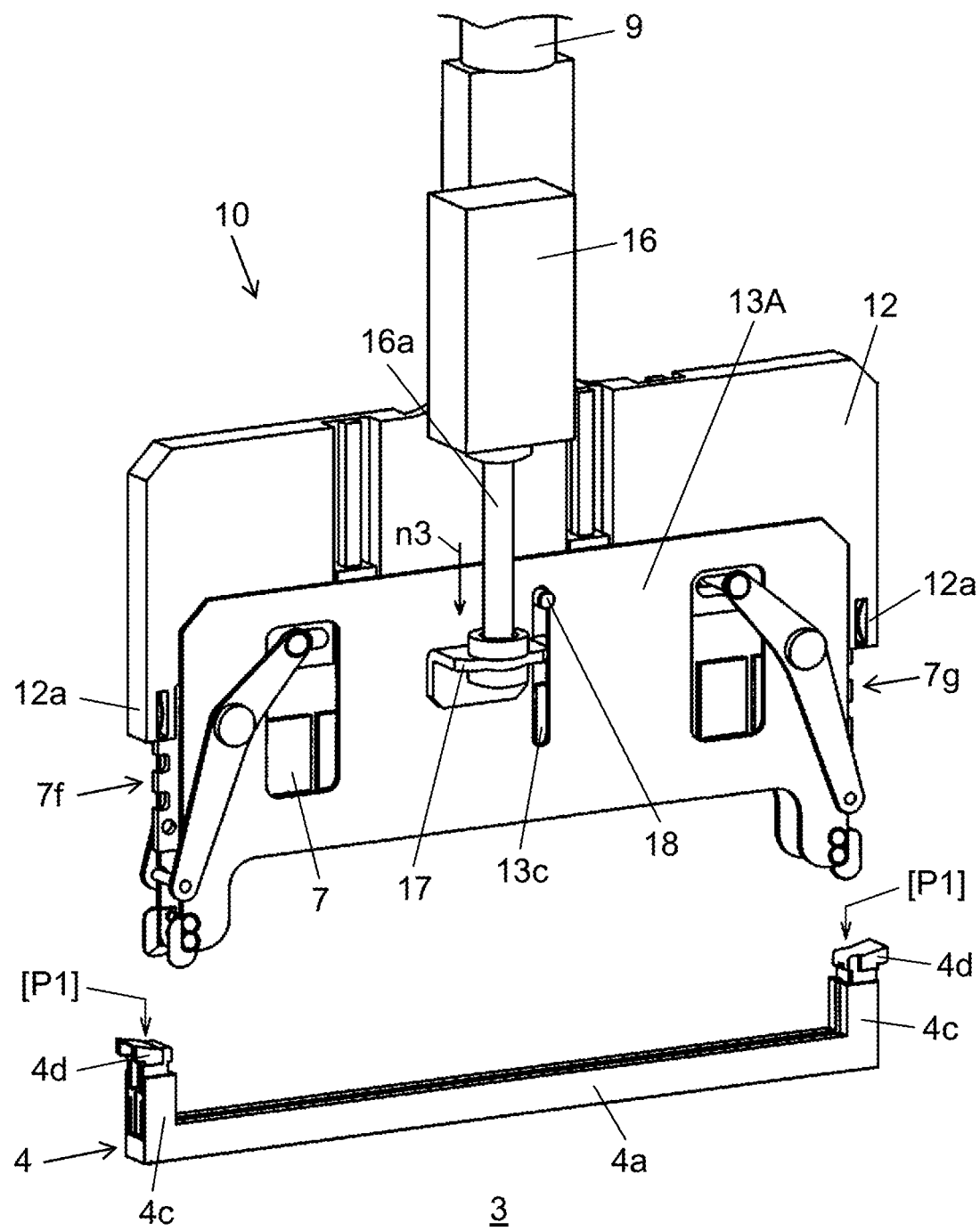
FIG. 10 is an explanatory view of a board insertion operation into the connector by the board insertion device of the embodiment.

Next, in board insertion tool 10, the board insertion operation for inserting board 7 held by holder 12 into connector 4 disposed in electronic board 3 is performed. In the board insertion operation, first, as illustrated in FIG. 10, rod 16a is caused to protrude (arrow n3) by driving cylinder 16 and insertion guider 13A is lowered to the bottom dead center via bracket 17 together with insertion guider 13B. Therefore, in guide groove 13c of insertion guider 13A, guide pin 18 is positioned at the uppermost end. In this state, board insertion tool 10 is moved above connector 4 that is the insertion target of the board and holder 12 is positioned with respect to base portion 4a. In this case, ejector 4d installed in side edge portion 4c of connector 4 is positioned at closed position [P1] at which the insertion of board 7 is prohibited.

Figure 11:
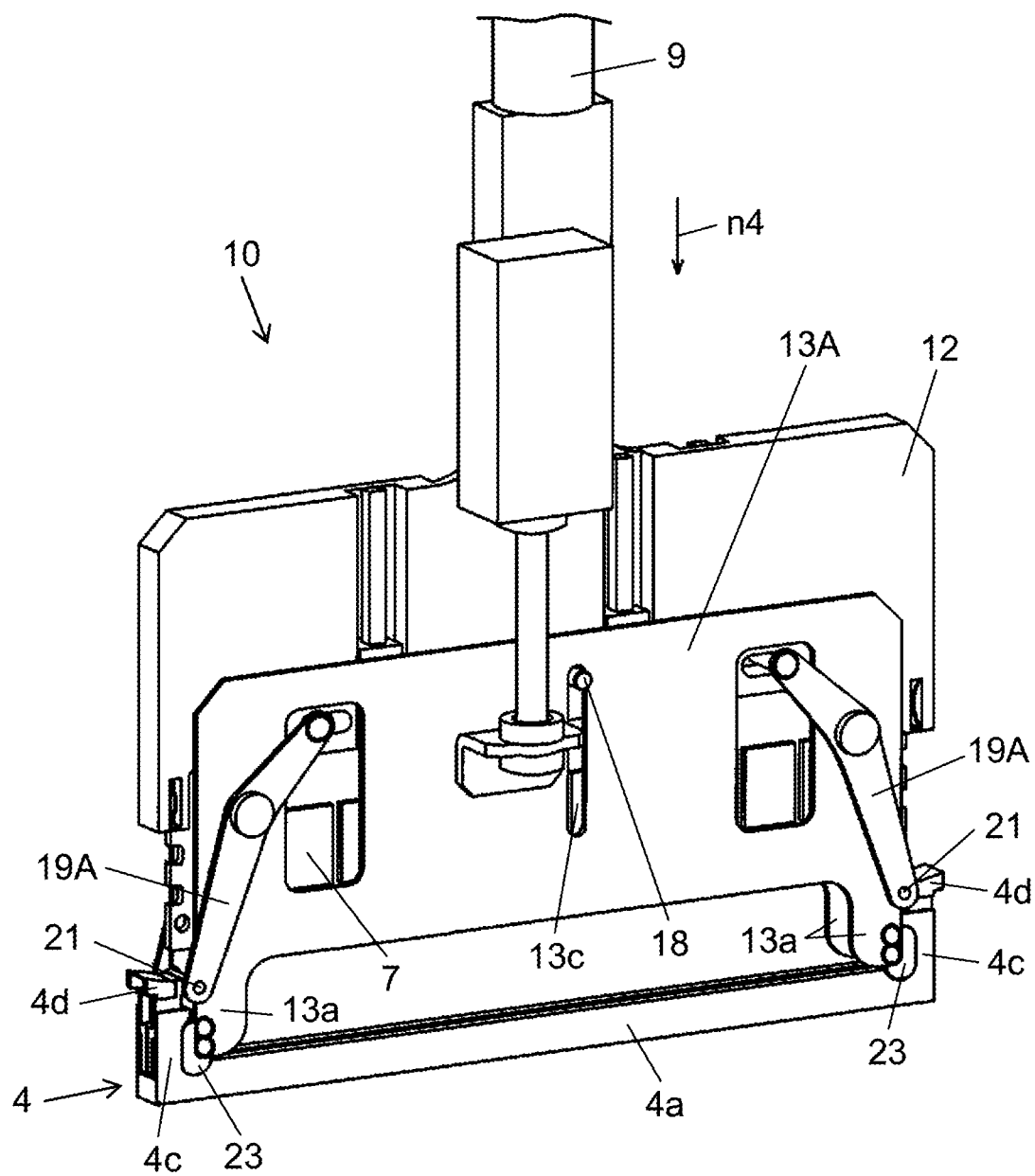
FIG. 11 is an explanatory view of a board insertion operation into the connector by the board insertion device of the embodiment.

Next, as illustrated in FIG. 11, board insertion tool 10 is lowered (arrow n4) and distal end portions 30 (distal end extending portions 13a and positioning members 23) of the lower ends of insertion guiders 13A and 13B abut against base portion 4a and side edge portions 4c. Therefore, height positions of insertion guiders 13A and 13B are in a state of being fixed. In this case, the correction of the positional deviation between insertion guiders 13A and 13B, and connector 4 is performed by tapered surfaces 23a and 23b formed in positioning members 23. In this state, connecting members 21 of the lower end portions of lever members 19A and 19B are positioned on the inside of ejectors 4d installed in side edge portions 4c. In this state, insertion guiders 13A and 13B are positioned at the bottom dead center and guide pin 18 is positioned at the uppermost end in guide groove 13c.

Figure 12:
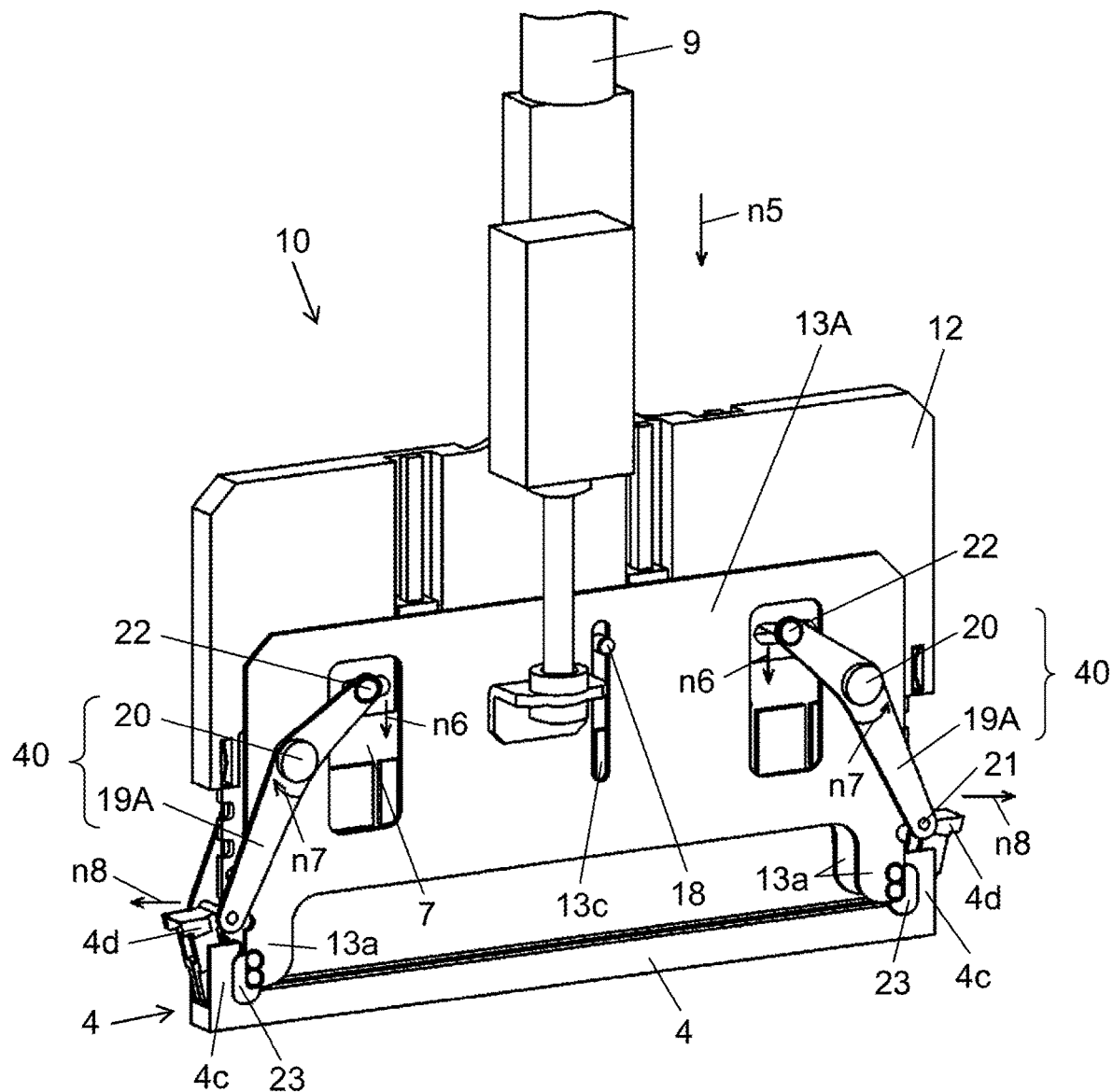
FIG. 12 is an explanatory view of a board insertion operation into the connector by the board insertion device of the embodiment.

Thereafter, as illustrated in FIG. 12, board insertion tool 10 is further lowered (arrow n5) and holder 12 is relatively lowered by a predetermined amount with respect to insertion guiders 13A and 13B of which the height positions are fixed (see the position of guide pin 18 in guide groove 13c). Therefore, roller members 22 of lever members 19A and 19B are pressed down (arrows n6) by the amount of downward displacement and lever members 19A and 19B rotate around fulcrums 20 in arrow n7 directions by a rotation amount corresponding to the press-down amount. As a result, connecting members 21 provided in the lower end portions of lever members 19A and 19B push ejectors 4d outward (arrows n8).

Figure 13:
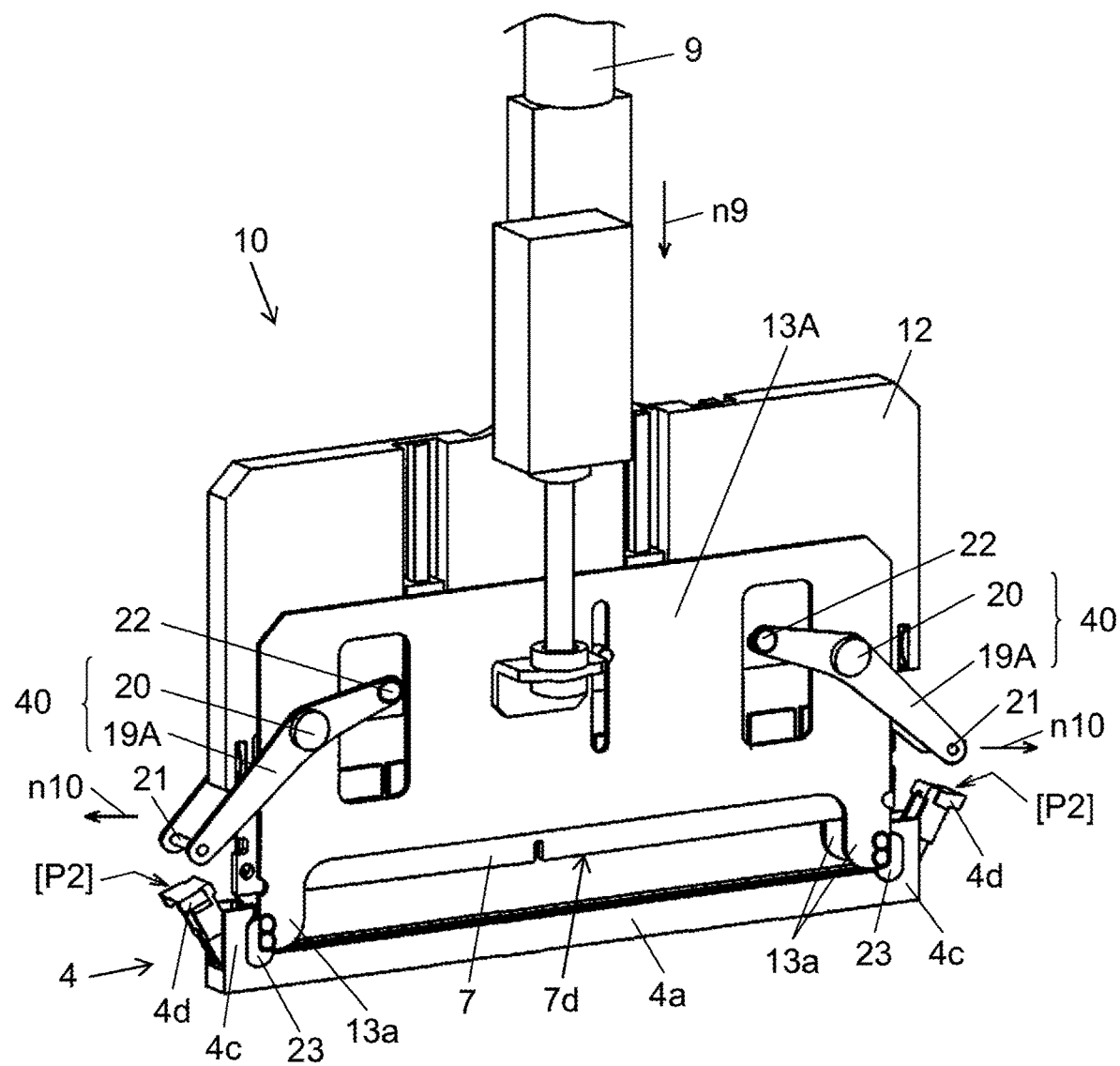
FIG. 13 is an explanatory view of a board insertion operation into the connector by the board insertion device of the embodiment.

Next, as illustrated in FIG. 13, board insertion tool 10 is further lowered (arrow n9) and holder 12 is relatively lowered with respect to insertion guiders 13A and 13B. By the relative lowering, lever members 19A and 19B similarly rotate around fulcrums 20. As a result, connecting members 21 in the lower end portions of lever members 19A and 19B further push ejectors 4d outward (arrows n10). Therefore, ejectors 4d are positioned in open positions [P2] at which the insertion of board 7 is allowed.

Figure 14:
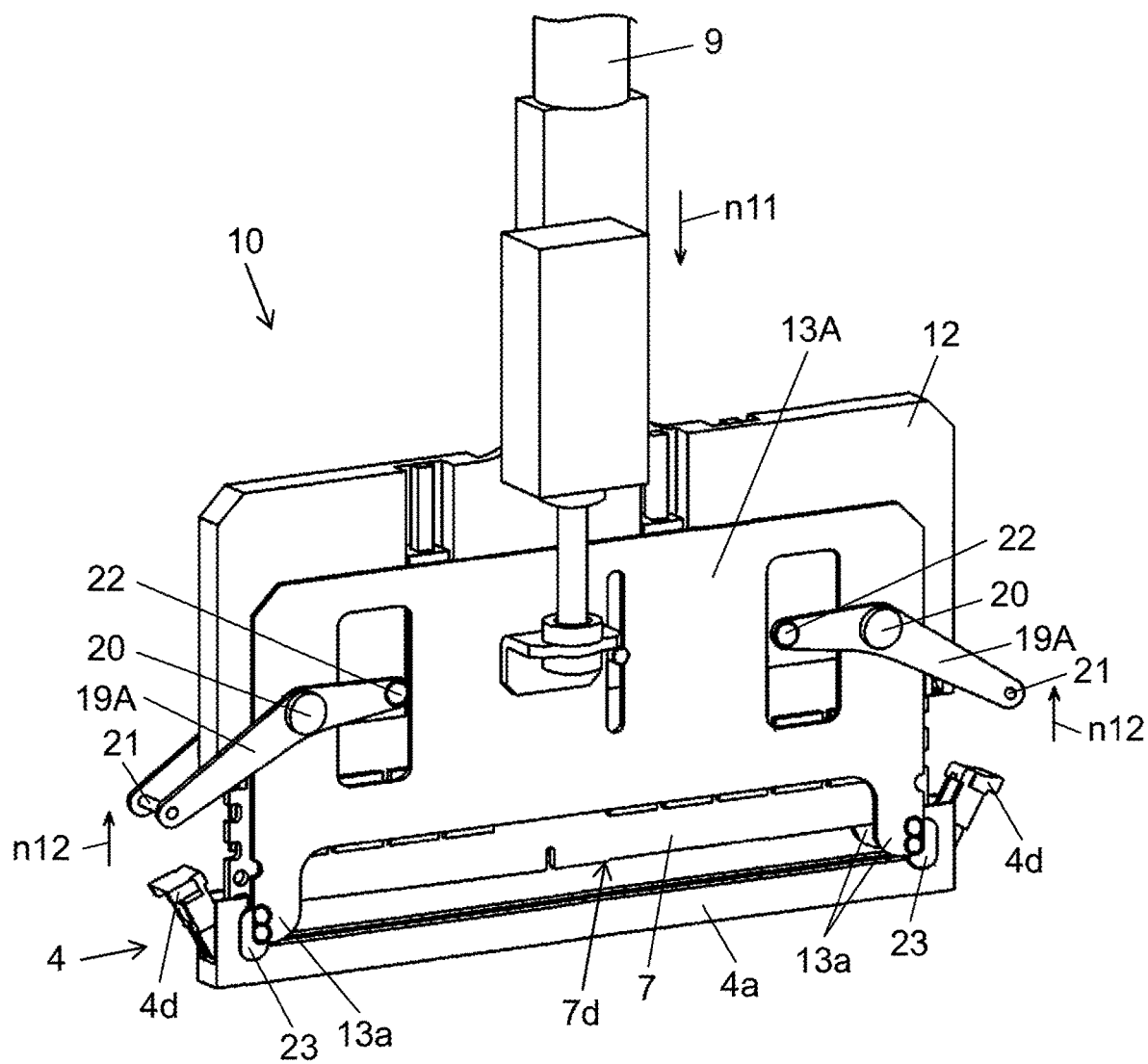
FIG. 14 is an explanatory view of a board insertion operation into the connector by the board insertion device of the embodiment.

Thereafter, as illustrated in FIG. 14, board insertion tool 10 is further lowered (arrow n11) and holder 12 is further relatively lowered with respect to insertion guiders 13A and 13B. Therefore, first end surface 7d of board 7 held in holder 12 approaches base portion 4a. At the same time, due to the relative lowering of holder 12, lever members 19A and 19B similarly rotate around fulcrums 20 and connecting members 21 in the lower end portions of lever members 19A and 19B move upward (arrows n12).

Figure 15:
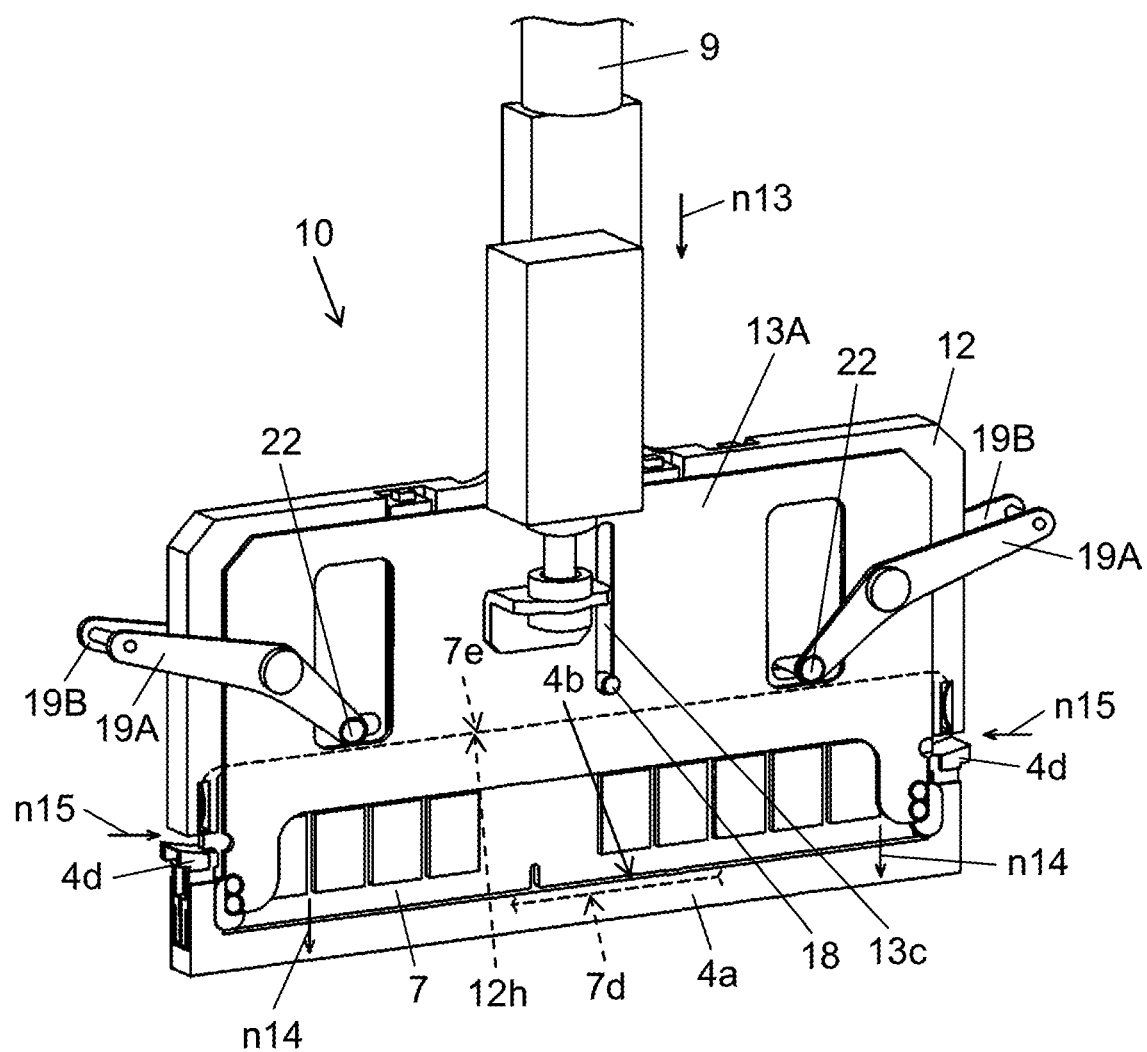
FIG. 15 is an explanatory view of a board insertion operation into the connector by the board insertion device of the embodiment.

As illustrated in FIG. 15, board insertion tool 10 is further lowered (arrow n13) and holder 12 is positioned at the bottom dead center with respect to insertion guiders 13A and 13B (see the position of guide pin 18 in guide groove 13c). Therefore, first end surface 7d of board 7 held in holder 12 is inserted into insertion groove 4b of base portion 4a (arrows n14). The insertion operation is performed by pressing second end surface 7e by pressing portion 12h (see FIGS. 5A to 5C) of holder 12. Ejectors 4d return (arrows n15) from open positions [P2] (see FIG. 13) to closed positions [P1] (see FIG. 10) by the insertion of first end surface 7d into insertion groove 4b. Therefore, third end surface 7f and fourth end surface 7g of board 7 are fixed by ejectors 4d and board 7 is prevented from falling off from insertion groove 4b.

Figure 16:
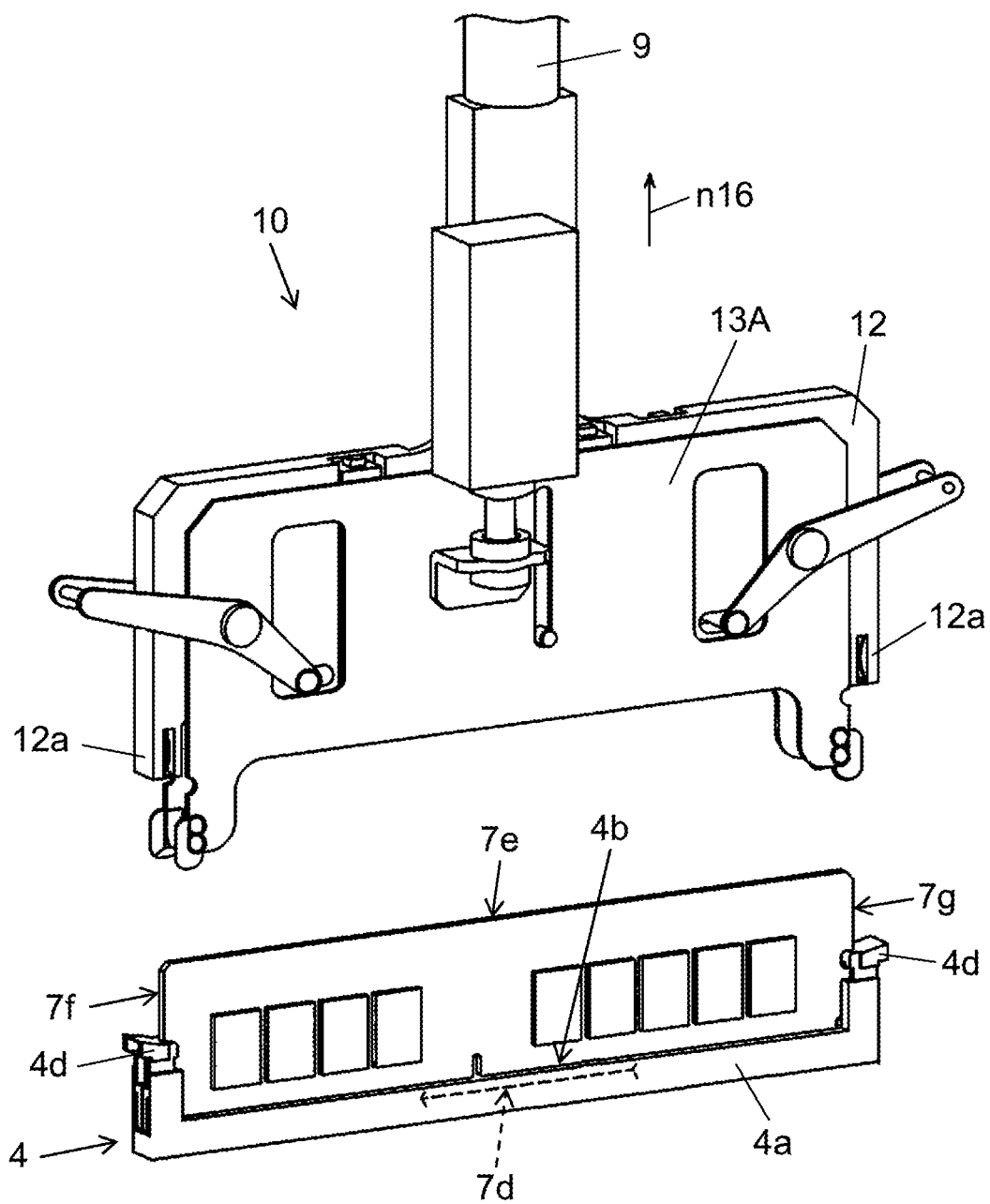
FIG. 16 is an explanatory view of a board insertion operation into the connector by the board insertion device of the embodiment.

When the insertion operation of one board 7 is completed in this manner, that is, as illustrated in FIG. 16, when first end surface 7d of board 7 is inserted into insertion groove 4b of base portion 4a, and third end surface 7f and fourth end surface 7g are in the state of being fixed by ejectors 4d, board insertion tool 10 is raised (arrow n16). In this case, board insertion tool 10 is in a state where insertion guiders 13A and 13B are relatively raised with respect to holder 12, board insertion tool 10 of this state is moved upward board supplier 6, and thereby pick-up of new board 7 is performed, and similarly, the insertion into connector 4 is repeatedly executed. In the embodiment, an example, in which conversion mechanisms 40 are provided in insertion guiders 13A and 13B, and are engaged with holder 12, is illustrated. However, conversion mechanisms 40 may be provided in holder 12 to be engaged with insertion guiders 13A and 13B.

As described above, board insertion tool 10 as the board insertion device illustrated in the embodiment has a configuration in which board 7 including terminals 7c on first end surface 7d is inserted into connector 4 including insertion groove 4b into which board 7 is inserted and ejectors 4d capable of moving between open positions [P2] at which the insertion of board 7 into insertion groove 4b is allowed and closed positions [P1] at which the insertion of board 7 into insertion groove 4b is prohibited. Board insertion tool 10 is configured to include holder 12 which holds board 7 in a state where first end surface 7d is exposed; insertion guiders 13A and 13B which are slidably provided in holder 12 in the insertion direction of board 7, and include distal end portions 30 protruding in the insertion direction from first end surface 7d of board 7 held in holder 12 and abutting against connector 4 when inserting board 7 into connector 4; abutting portions abutting against ejectors 4d when inserting board 7 into connector 4; and conversion mechanisms 40. Conversion mechanisms 40 are provided in insertion guiders 13A and 13B, and engaged with holder 12, or are provided in holder 12 and engaged with insertion guiders 13A and 13B. Therefore, it is possible to automate the insertion work of the board such as the memory module into the connector which is performed manually in the related art with a large workload and to achieve labor saving and the improvement of work efficiency.

According to the disclosure, it is possible to automate the insertion work of the board such as the memory module into the connector and to achieve labor saving and the improvement of work efficiency.

What is claimed is:

1. A board insertion device which inserts a board into a connector,
    the board having a first end surface on which a terminal is provided, and a second end surface opposite to the first end surface, and
    the connector having an insertion groove into which the board is inserted and an ejector capable of switching between an open position at which insertion of the board into the insertion groove is allowed and a closed position at which the insertion of the board into the insertion groove is prohibited,
    the board insertion device comprising:
    a holder configured to hold the board in a state where the first end surface is exposed;
    an insertion guider which is slidably provided in the holder in an insertion direction of the board into the connector and which includes a distal end portion configured to protrude in the insertion direction from the first end surface of the board to be held in the holder and configured to abut against the connector during insertion of the board into the connector;
    an abutting portion configured to abut against the ejector during the insertion of the board into the connector; and
    a conversion mechanism configured to convert a change of a relative position between the holder and the insertion guider into a movement of the abutting portion for changing a position of the ejector from the closed position to the open position, and
    wherein the conversion mechanism is provided at the insertion guider and engaged with the holder or is provided at the holder and engaged with the insertion guider.

2. The board insertion device of claim 1,
    wherein the conversion mechanism has a fulcrum provided at the insertion guider and a lever member of which an intermediate portion is pivotally supported by the fulcrum, and
    wherein the abutting portion is provided at a first end portion of the lever member, and a second end portion of the lever member is engaged with the holder.

3. The board insertion device of claim 1, further comprising:
    a driver that is provided in the holder and moves the insertion guider relative to the holder in the insertion direction.

4. The board insertion device of claim 1,
    wherein the plurality of distal end portions are disposed so as to sandwich the connector therebetween
    a tapered surface for correcting positional deviation between the board and the connector is formed on a contact surface of the distal end portion with the connector.

5. The board insertion device of claim 4,
    wherein the distal end portion includes a distal end extending portion and a positioning member, and the tapered surface is formed on the positioning member.

6. The board insertion device of claim 4,
    wherein the distal end portion is one of a plurality of distal end portions, and
    wherein the plurality of distal end portions are disposed so as to sandwich the connector therebetween.

7. The board insertion device of claim 1,
    wherein the holder includes a pressing portion configured to abut against the second end surface and a gripping portion configured to grip the board by abutting against a third end surface and a fourth end surface opposite to each other, other than the first end surface and the second end surface of the board.

8. The board insertion device of claim 7,
    wherein the gripping portion includes a spring member configured to press at least one of the third end surface and the fourth end surface.

9. The board insertion device of claim 1, wherein the conversion mechanism is configured to allow the holder to be withdrawn from the board while the board is retained in the connector.

10. The board insertion device of claim 1, wherein the conversion mechanism is configured to cause the abutting portion to disengage from the ejector while board is retained in the connector.

11. A board installation apparatus including a robot having a work arm, and the board insertion device of claim 1 being coupled to the work arm for manipulating one or more boards relative to respective connectors.

12. The board insertion device of claim 1, wherein the conversion mechanism is configured such that movement of one of the insertion guider and the holder relative to the other of the insertion guider and the holder causes a sliding action of the conversion mechanism, thereby effecting outward rotation of the conversion mechanism for engaging with and opening the ejector of the connector.

13. The board insertion device of claim 1, wherein the conversion mechanism is engaged with each of the insertion guider and the holder to convert linear translation of one of the insertion guider and the holder relative to the other of the insertion guider and the holder into rotational motion of a lever arm of the conversion mechanism.

* * * * *